United States Patent [19]

Kalthoff

[11] Patent Number: 4,954,769
[45] Date of Patent: Sep. 4, 1990

[54] CMOS VOLTAGE REFERENCE AND BUFFER CIRCUIT

[75] Inventor: Timothy V. Kalthoff, Tucson, Ariz.

[73] Assignee: Burr-Brown Corporation, Tucson, Ariz.

[21] Appl. No.: 308,109

[22] Filed: Feb. 8, 1989

[51] Int. Cl.$^5$ .................................................. G05F 3/30
[52] U.S. Cl. .................................. 323/313; 307/296.1; 307/296.6; 307/296.7; 330/253; 330/257; 330/260
[58] Field of Search ........................... 323/313–316, 323/907; 365/189.09; 330/253, 257, 260; 307/296.1, 296.6, 296.7

[56] References Cited

U.S. PATENT DOCUMENTS

| | | | |
|---|---|---|---|
| 3,969,682 | 7/1976 | Rossum | 330/260 X |
| 4,587,478 | 5/1986 | Kasperkovitz et al. | 323/907 X |
| 4,590,419 | 5/1986 | Moriarty, Jr. | 323/907 X |
| 4,633,165 | 12/1986 | Pietkiewicz et al. | 323/907 X |
| 4,644,249 | 2/1987 | Chang | 323/907 X |
| 4,656,415 | 4/1987 | Draxelmayr | 323/907 X |
| 4,683,416 | 7/1987 | Bynum | 323/907 X |
| 4,786,856 | 11/1988 | Metcalf et al. | 323/907 X |
| 4,795,961 | 1/1989 | Neidorff | 323/907 X |
| 4,797,577 | 1/1989 | Hing | 323/907 X |
| 4,808,908 | 2/1989 | Lewis et al. | 323/907 X |

Primary Examiner—Peter S. Wong
Assistant Examiner—Emanuel Todd Voeltz
Attorney, Agent, or Firm—Cahill, Sutton & Thomas

[57] ABSTRACT

A stable, low noise, low output impedance CMOS reference voltage circuit includes a CMOS/bipolar band gap circuit producing a reference voltage on the source of a source follower transistor driven by an output of a CMOS differential amplifier which maintains a $V_{THERMAL}$ voltage across the bases of a pair of emitter follower transistors driving the inputs of the CMOS differential amplifier. A power supply noise rejection circuit includes a cascode MOSFET coupling the drain of the source follower output transistor to a positive power supply voltage conductor. A current mirror circuit greatly attenuates any power supply voltage perturbations before they reach the gate of the cascode MOSFET. A unity gain buffer includes a CMOS differential amplifier input stage with one input coupled to the output of the source follower transistor and an output driving a CMOS operational transconductance amplifier.

21 Claims, 2 Drawing Sheets

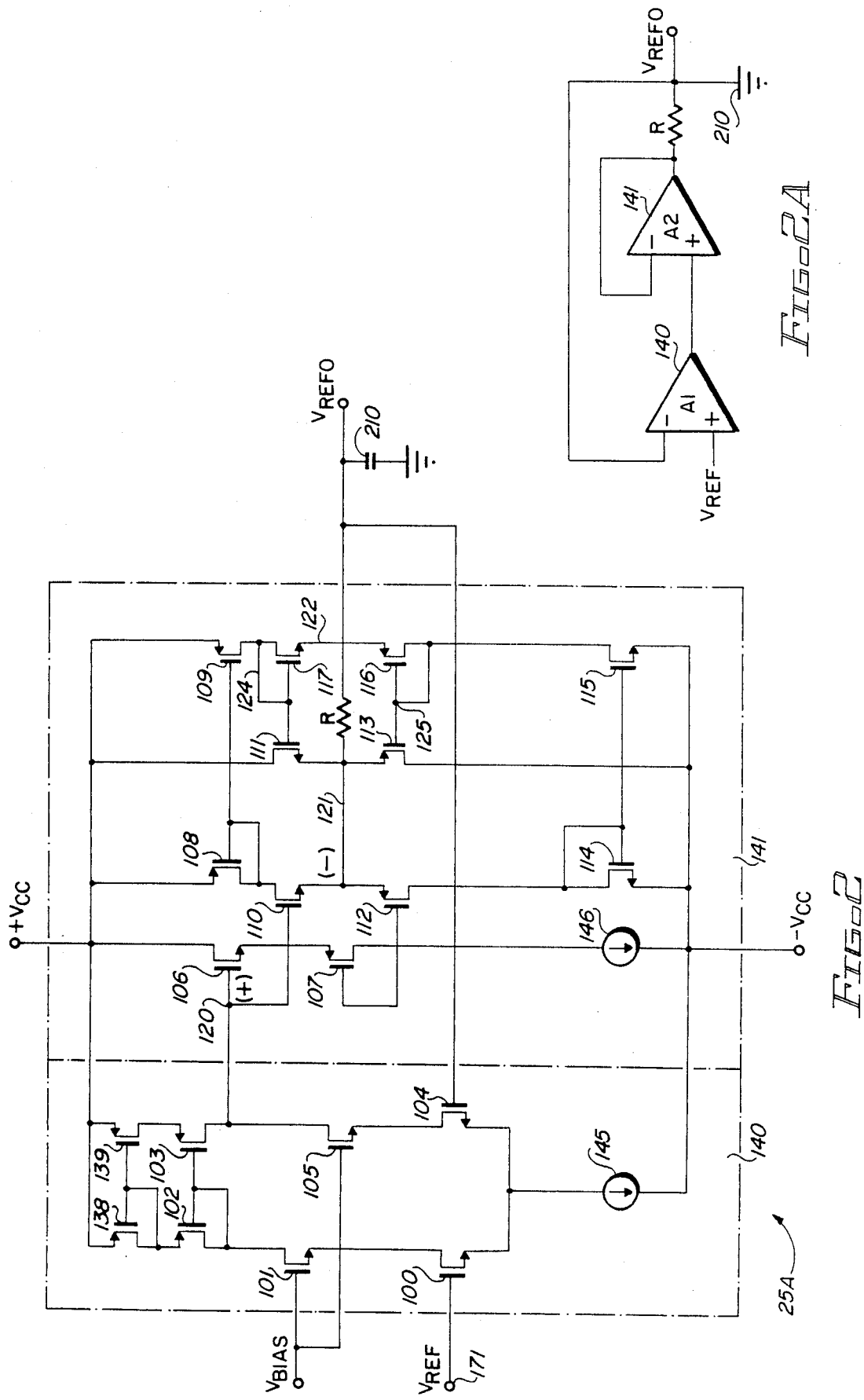

CMOS VOLTAGE REFERENCE AND BUFFER CIRCUIT

BACKGROUND OF THE INVENTION

The invention relates to a CMOS band gap circuit and a buffer amplifier circuit providing a low noise, stable reference voltage that is free of power supply noise and is insensitive to transient signals on the output conductor.

Band gap circuits typically are utilized in integrated circuits to generate stable reference voltages which are independent of absolute temperature. A band gap circuit generates a voltage $V_{THERMAL}$ which is proportional to temperature and a function of the difference in $V_{BE}$ voltages of two transistors operating at different current densities. The voltage $V_{THERMAL}$ is "gained up" by a resistive multiplier circuit to a voltage having a temperature coefficient of +2 millivolts per degree Centigrade, and that voltage is summed with a $V_{BE}$ voltage of an NPN transistor, which has a temperature coefficient of −2 millivolts per degree Centigrade. The summing thereby produces a band gap voltage which is independent of temperature. Band gap circuits are used widely in bipolar integrated circuits. There also is a need for stable voltage reference circuits in CMOS integrated circuits. Some band gap circuits have been implemented in CMOS integrated circuits containing NPN transistors.

CMOS circuits are known to be quite susceptible to high frequency incremental power supply voltage variations, i.e., to power supply noise. One circuit technique for avoiding the effects of power supply noise is the use of "cascode" connected field effect transistors (FETs) connected in series between the power supply voltage bus and the drain of a FET which is to be isolated from the effects of the power supply noise. The gate of the cascode transistor is connected to a suitable reference voltage that does not vary as much as the power supply voltage. It is especially important to be able to essentially eliminate the effects of power supply noise on internal reference voltages that are generated in the CMOS circuit.

A basic requirement of any internal reference voltage source in a CMOS integrated circuit in which "transient loads" are switched to the reference voltage source is that it have a low output impedence so that the generated reference voltage is relatively "immune" to noise that may be coupled onto the reference voltage source.

There is a presently unmet need for a stable, low noise, low output impedance reference voltage circuit that can be implemented in CMOS technology.

SUMMARY OF THE INVENTION

It is an object of the present invention to provide a buffer circuit with a low output impedance, which reacts very rapidly to a transient loading on its output node.

It is another object of the invention to provide a stable, low noise, low output impedance reference voltage in a CMOS integrated circuit.

Briefly described, and in accordance with one embodiment thereof, the invention provides a stable, low noise, low output impedance CMOS voltage reference circuit including a band gap circuit, a power supply noise rejection circuit connected to an output of the band gap circuit, and a unity gain buffer including a first CMOS differential amplifier having a first input connected to the output of the band gap voltage, an output coupled to an input of a CMOS operational transconductance amplifier, an output of which is fed back to a second input of the first CMOS differential amplifier and a second input of the CMOS operational transconductance amplifier. A large capacitor is connected to the output of the operational transconductance amplifier to absorb high frequency "glitches". (The buffer must respond to the residual of a glitch in a fast manner and recharge the capacitor to its initial value prior to the glitch.) In the described embodiment of the invention the band gap circuit includes first and second NPN transistors operated to have different current densities therein. A second CMOS differential amplifier having input terminals connected to the emitters of the first and second NPN transistors maintains the $V_{THERMAL}$ voltage equal to the difference in the $V_{BE}$ voltages of the first and second NPN transistors across the bases of the first and second NPN transistors in response to feedback from an output of the second CMOS differential amplifier. A source follower MOSFET driven by the output of the second CMOS differential amplifier is connected to a power supply noise rejection circuit which includes a cascode connected MOSFET connected between a positive power supply voltage conductor and a drain of the source follower MOSFET. The gate of the cascode MOSFET is connected to the drain of a P-channel current mirror control MOSFET that "mirrors" a current of the source follower MOSFET through a P-channel current mirror output MOSFET. Incremental variations in the power supply voltage are substantially attenuated by a ratio of the $g_m$ of a diode-connected N-channel MOSFET with its source connected to the source of the source follower MOSFET and its drain connected to the drain of the P-channel current mirror output MOSFET and the $g_{ds}$ of the P-channel current mirror MOSFET.

The CMOS operational transconductance amplifier of the unity gain buffer includes a first N-channel MOSFET connected in series with a first P-channel diode-connected MOSFET and a current source, the source of the first N-channel MOSFET and the source of the first diode-connected P-channel MOSFET being connected together. The gate electrodes of the first N-channel MOSFET and the first P-channel MOSFET are connected to the gates of a pair of similarly ratioed MOSFETs including a first N-channel pullup MOSFET and a first P-channel pulldown MOSFET with its source connected to the source of the first N-channel pullup MOSFET. The drain currents of the first N-channel pullup MOSFET and the first P-channel pulldown MOSFET are mirrored through P-channel and N-channel current mirrors, respectively, to control gate voltages of a second N-channel pullup transistor and a second P-channel pulldown transistor to provide gain that results in low output impedance for the operational transconductance amplifier. The transconductance amplifier is located within the feedback loop of the first CMOS differential amplifier. Therefore, the low output impedance of the operational transconductance amplifier is further reduced by the ratio of the open loop gain of the first CMOS differential amplifier to provide a very low output impedance for the entire buffer circuit and rapid response of the circuit to "compensate" for transient voltages imposed on the output of the CMOS buffer circuit.

BRIEF DESCRIPTION OF THE DRAWINGS

FIG. 2 is a schematic diagram of a high speed, low output impedence unity gain buffer circuit for buffering the reference voltage generated by the band gap circuit of FIG. 1 to provide a stable, low noise, low impedance reference voltage in a CMOS circuit.

FIG. 2A is a block diagram of the buffer circuit of FIG. 2.

DETAILED DESCRIPTION OF THE PREFERRED EMBODIMENT

Figure 1:
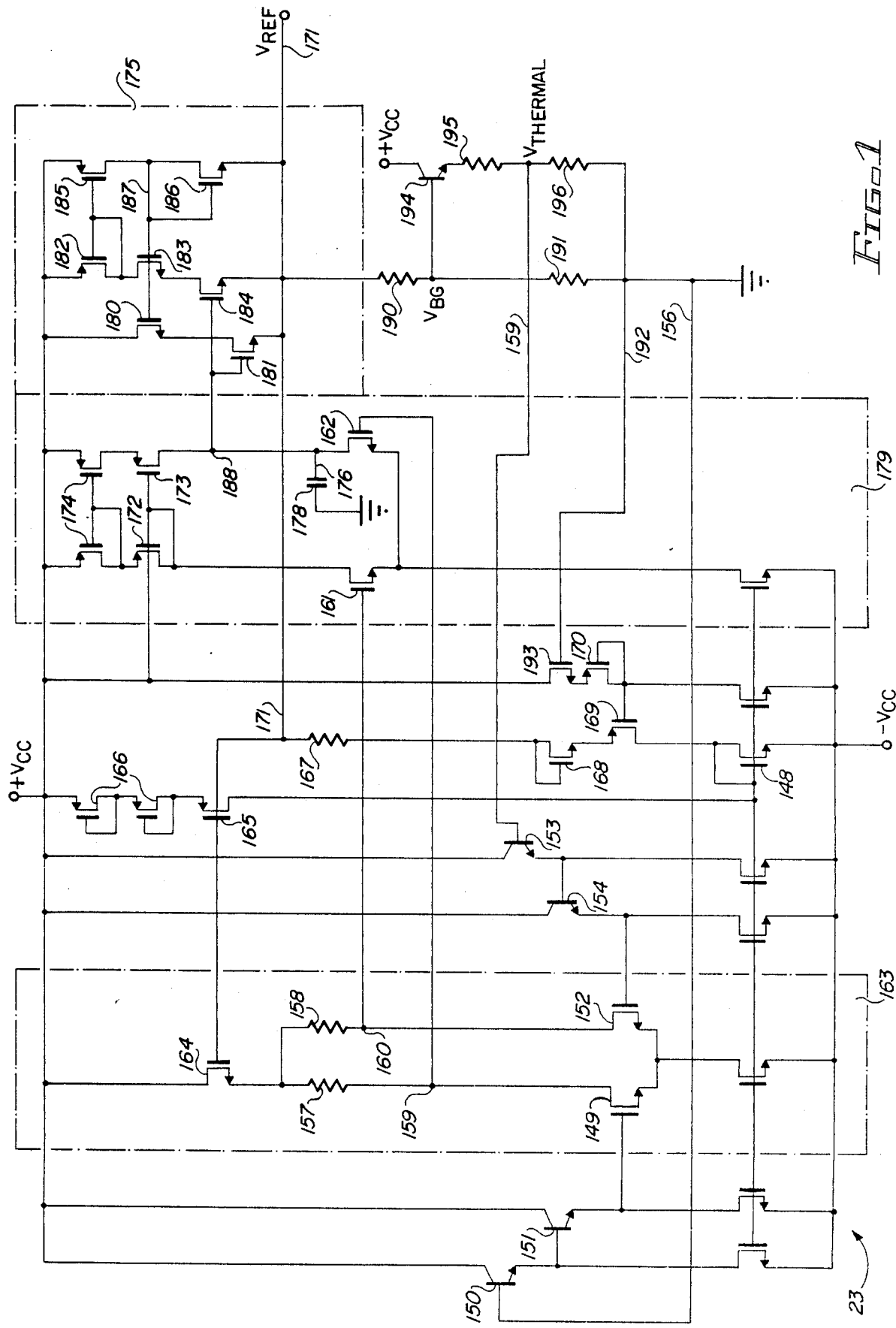
FIG. 1 is a schematic diagram of a band gap circuit including a power supply rejection circuit used in accordance with the present invention.

Referring first to FIG. 1, band gap circuit 23 (which may be used to implement block 23 in FIG. 1 of co-pending patent application "Dual Analog-To-Digital Converter with Single Successive Approximation Register" by Naylor et al., filed on even date herewith and incorporated herein by reference, includes two Darlington-connected NPN transistors 150 and 151 driving the gate of N-channel input MOSFET 149 of a differential amplifier 163. Darlington-connected NPN transistors 153 and 154 drive the gate of N-channel input MOSFET 152 of differential amplifier 163, and have emitter areas which are one-eighth of the emitter areas of transistors 150 and 151.

The shown N-channel bias current transistors with source electrodes connected to $-V_{CC}$ supply equal currents through transistors 150, 151, 153, and 154, so the current densities in transistors 153 and 154 are substantially higher than in transistors 150 and 151.

Differential amplifier 163 includes MOSFETS 149 and 152 and resistors 157 and 158, and drives the N-channel input MOSFETS 161 and 162 of a second differential amplifier 179. An output of differential amplifier 179 on conductor 188 drives an N-channel source follower transistor 181 that produces an output reference voltage $V_{REF}$ of approximately 2.75 volts. The voltage $V_{REF}$ on conductor 171 is fed back to the gate of an N-channel cascode-connected MOSFET 164 to improve the power supply rejection ratio of differential amplifier 163 and a P-channel MOSFET 165 which functions to ensure circuit startup.

The two diode connected P-channel MOSFETS 166 also assist circuit startup. The $V_{REF}$ voltage on conductor 171 also establishes a current through resistor 167, diode-connected N-channel MOSFET 168, P-channel MOSFET 169, and N-channel current mirror control diode-connected MOSFET 148 which establishes the gate-to-source voltage on all of the other current mirror N-channel MOSFETS the sources of which are connected to $-V_{CC}$.

The voltage $V_{REF}$ on conductor 171 produces a current through resistors 190 and 191 to maintain (through feedback) the band gap voltage on the base of NPN transistor 194. This band gap voltage $V_{BG}$ is the sum of the $V_{BE}$ voltage of transistor 194 and a "gained up" $V_{THERMAL}$ voltage. The $V_{THERMAL}$ voltage arises from the difference between the sum of the $V_{BE}$ voltages of transistors 150 and 151 and the sum of the $V_{BE}$ voltages of transistors 153 and 154 and is developed across resistor 196. Feedback of $V_{REF}$ through NPN transistor 194, resistor 195, and conductor 159 causes the series-connected differential amplifiers 163 and 179 to cause the gate-to-source voltages of N-channel MOSFETS 149 and 152 to be equal, ensuring that the $V_{THERMAL}$ voltage appears across resistor 196.

N-channel source follower MOSFET 181 has a channel-width-to-channel-length ratio approximately ten times that of N-channel MOSFET 184. Consequently, approximately one tenth of the output current that is supplied through source follower MOSFET 181 flows through MOSFET 184 and N-channel cascode MOSFET 183 and then is mirrored by P-channel current mirror control MOSFET 182 and P-channel current mirror output MOSFET 185 into diode-connected N-channel MOSFET 186. The $V_{GS}$ voltage of MOSFET 186 appears between conductors 171 and 187.

The difference between the $V_{GS}$ of transistor 186 and the $V_{GS}$ of N-channel MOSFET 180 is the $V_{DS}$ voltage of source follower transistor 181. This voltage is approximately 200 millivolts, and maintains source follower MOSFET 181 in the current saturation region of its operating characteristic, thereby ensuring low output impedance on conductor 171. Cascode MOSFET 180 isolates the $V_{DS}$ voltage of source follower transistor 181 from noise variations on $+V_{CC}$. The $g_m$ of MOSFET 186 is approximately 75 times the $g_{ds}$ of MOSFET 185, and therefore allows only roughly one percent of the $+V_{CC}$ noise to appear on conductor 187. Consequently, power supply rejection circuit 175 effectively isolates $V_{REF}$ from such $+V_{CC}$ noise.

Capacitor 178, which is approximatly 20 picofarads, but may be increased to about 0.1 microfarads by parallel connection of an external capacitor, can be used to filter from $V_{REF}$ the noise which has been amplified by the differential amplifiers 163 and 179. However, increasing the capacitance of capacitor 178 enough to filter such undesirable noise from $V_{REF}$ causes poor high frequency power supply rejection ratio of $V_{REF}$ unless the power supply rejection circuit described above is used, because if an incremental charge $+V_{CC}$ is coupled to the drain of MOSFET 181, the large value of capacitor 178 prevents conductor 188 from responding, thereby preventing $V_{REF}$ from varying in response to the variation in $+V_{CC}$.

Referring next to FIG. 2, the $V_{REF}$ voltage produced by the circuit of FIG. 1 is applied to the gate of N-channel input MOSFET 100 of differential amplifier 140. The source of MOSFET 100 is connected to the source of another N-channel input MOSFET 104. The sources of MOSFETS 100 and 104 are connected to a constant current source 145, which can be implemented by means of a conventional N-channel bias MOSFET. The drains of MOSFETS 100 and 104 are connected to the sources of N-channel cascode-connected MOSFETs 101 and 105, respectively. The gates of MOSFETs 101 and 105 are connected to a bias voltage to prevent MOSFETs 100 and 104 from going into their "triode" regions. The drain of cascode MOSFET 101 is connected to the drain and gate of P-channel diode-connected MOSFET 102, the source of which is connected to the drain and gate of P-channel current mirror control MOSFET 138, which has its source connected to $+V_{CC}$. The drain of cascode MOSFET 105 is connected by conductor 120 to the drain of P-channel cascode 103 and to the gates of N-channel source follower MOSFETs 106 and 110 of a CMOS operational transconductance amplifier 141. The source of MOSFET 103 is connected to the drain of P-channel current mirror output MOSFET 139, which has its source connected to $+V_{CC}$ and its gate connected to the gate of MOSFET 138. The drain of MOSFET 106 is connected +V$_{CC}$.

The source of MOSFET 106 is connected to the source of P-channel diode connected MOSFET 107, the gate and drain of which are connected to constant current source 146, which may be an N-channel bias MOSFET. The gate and drain of MOSFET 107 also are connected to the gate of P-channel MOSFET 112, the source of which is connected by conductor 121 to the source of N-channel MOSFET 110.

The drain of MOSFET 110 is connected to the drain and gate of P-channel current mirror control transistor 108, the source of which is connected to +V$_{CC}$. The drain and gate of MOSFET 108 also are connected to the gate of P-channel current mirror output transistor 109, the source of which is connected to +V$_{CC}$. The drain of MOSFET 109 is connected to the gate and drain of N-channel MOSFET 117, the source of which is connected to conductor 122. The gate and drain of MOSFET 117 also are connected to the gate of N-channel MOSFET 111, the drain of which is connected to +V$_{CC}$. The source of N-channel MOSFET 111 is connected to conductor 121.

The drain of MOSFET 112 is connected to the gate and drain of MOSFET 114 and to the gate of N-channel MOSFET 115. The sources of MOSFETs 114 and 115 are connected to −V$_{CC}$. The drain of MOSFET 115 is connected to the gate and drain of P-channel MOSFET 116 and to the gate of P-channel MOSFET 113. The source of MOSFET 116 is connected to conductor 122. The source of P-channel 113 is connected to conductor 121, and its drain is connected to −V$_{CC}$. A small resistor R is connected between conductor 121 and V$_{REFO}$. The output reference voltage V$_{REFO}$ is connected to the gate of input MOSFET 104 of differential amplifier 140. A transient suppression capacitor 210 may be connected between V$_{REFO}$ and ground.

FIG. 2A shows a block diagram of the buffer circuit 25A of FIG. 2. The buffer includes differential amplifier 140 with gain A1 receiving the voltage V$_{REF}$ generated by the band gap circuit of FIG. 1 on its non-inverting input. The output of amplifier 140 is connected to the non-inverting input of an operational transconductance amplifier 141. Its output is connected to its inverting input. The transient suppression capacitor 210 can be connected to the V$_{REFO}$ output if necessary to reduce high frequency glitches. Buffer 25A can be designed so that capacitor 210 together with resistor R will provide high frequency stability. Transient suppression capacitor 210, which may be about 10 microfarads, acts as a charge reservoir to allow the buffer circuit to rapidly respond to glitches of V$_{REFO}$. V$_{REFO}$ is fed back to the inverting input of amplifier 140.

Amplifier stages 140 and 141 are included within dotted line blocks as shown in FIG. 2. Cascode MOSFETs 101 and 105 provide improved DC precision by maintaining constant V$_{DS}$ voltages across MOSFETs 100 and 104. The output of differential amplifier 140 is applied to the gates of N-channel MOSFETs 106 and 110. Conductor 120 is, in essence, the non-inverting input of transconductance amplifier 141, which has a configuration somewhat similar to that of a conventional Diamond follower circuit, known to those skilled in the art. Conductor 121 is the inverting input of transconductance amplifier 141 of FIG. 2. The ratio of the channel-width-to-channel-length ratios of N-channel MOSFET 106 to that of N-channel MOSFET 110 is the same as the ratio of channel-width-to-channel-length ratio of P-channel MOSFET 107 to that of P-channel MOSFET 112, so as to provide proper bias to MOSFETs 110 and 112.

It can be seen that there is a high open loop signal gain from conductor 121 to conductor 122. The output impedance of amplifier 141 in the feedback configuration shown is effectively equal to the resistance of the parallel combination of the output impedances of N-channel MOSFET 111 and P-channel MOSFET 113 divided by the open loop signal gain. The occurrence of the high signal gain can be understood by recognizing that if the voltage on conductor 120 is fixed and node 121 is perturbed, then signal currents will flow from the sources of MOSFETs 110 and 112. These signal currents also flow through the drains of MOSFETs 110 and 112 and are consequently mirrored to react with the high parallel output impedances of MOSFETs 115 and 109 on conductor 122.

Resistor R and transient suppression capacitor 210 can be selected to cause the frequency response of stage 141 to roll off ahead of the frequency response of stage 140, thereby maintaining stability.

The operational transconductance amplifier 141 is located within the feedback loop of differential amplifier 140. Therefore, the low output impedance of the operational transconductance amplifier 141 is further reduced by the ratio of the open loop voltage gain of the operational amplifier 140 to provide a very low output impedance for the entire buffer circuit 25A and rapid response of the buffer circuit to counteract transient voltages imposed on the output of the CMOS buffer circuit 25A.

The above described reference voltage circuit provides low noise and good output "glitch resistance" and fast settling response to "glitches" imposed on the output of the buffer circuit 25A. The described buffer circuit effectively isolates the band gap circuit output voltage from output transients. Two or more of the buffer circuits may be connected to the same band gap circuit to provide good tracking of the two references voltages at the outputs of the two buffers, with a high degree of isolation from "cross-talk" therebetween.

Furthermore, the described buffer circuit 25A provides low noise operation by using large channel width-to-length ratios (i.e., approximately 300), and provides the very good output glitch resistance and fast settling response to the glitches, and therefore can be used in many other applications.

While the invention has been described with reference to a particular embodiment thereof, those skilled in the art will be able to make various modifications to the described embodiment without departing from the true spirit and scope of the invention.

What is claimed is:

1. A voltage reference circuit that is resistant to power supply noise, comprising in combination:
   (a) a band gap circuit including first and second transistors having different current densities therein and having a resistor coupled between a base of the first transistor and a base of the second transistor, a first FET differential amplifier circuit having first and second input terminals coupled to an emitter of the first transistor and an emitter of the second transistor, respectively;
   (b) a first FET having a gate coupled to an output of the first FET differential amplifier circuit and a source coupled to a first output conductor and producing thereon a first reference voltage;

(c) feedback means coupled to the output of the first FET differential amplifier circuit for applying a portion of the first reference voltage to maintain a $V_{THERMAL}$ voltage across the resistor equal to the difference between a $V_{BE}$ voltage of the first transistor and a $V_{BE}$ voltage of the second transistor so as to maintain equal voltages on the first and second input terminals;

(d) a power supply noise rejection circuit including
  i. a second FET having a gate coupled to the output of the first FET differential amplifier circuit and a source coupled to the first output conductor, the second FET having a channel width-to-length ratio substantially less than a channel width-to-length ratio of the first FET,
  ii. a first cascode FET coupling a drain of the first FET to a first supply voltage conductor,
  iii. a second cascode FET having a source coupled to a drain of the second FET,
  iv. a third FET having a source coupled to the first supply voltage conductor, and a gate and a drain coupled to a drain of the second cascode FET,
  v. a fourth FET having a source coupled to the first supply voltage conductor and a gate coupled to the gate of the third FET, and a drain coupled to the gate of the first and second cascode FETs,
  vi. a fifth FET having a gate and drain coupled to the gate of the first and second cascode FETs and a source coupled to the first output conductor.

2. The voltage reference circuit of claim 1 wherein the first and second transistors are NPN transistors, the first, second, and fifth FETs and the first and second cascode FETs are N-channel MOSFETs and wherein the third and fourth FETs are P-channel MOSFETs.

3. The voltage reference circuit of claim 2 wherein the current density of the first transistor is approximately eight times the current density of the second transistor.

4. The voltage reference circuit of claim 2 wherein the channel-width-to-length ratio of the first FET is approximately ten times that of the second FET, and wherein a $g_m$ of the fifth FET is approximately 75 times a $g_{ds}$ of the fourth FET.

5. The voltage reference circuit of claim 4 wherein the channel width-to-length ratio of the first FET is approximately 300.

6. The voltage reference circuit of claim 1 further comprising a unity gain buffer circuit including
  i. a second FET differential amplifier circuit having a non-inverting input coupled to the first output conductor, and a single ended output conductor;
  ii. a FET operational transconductance amplifier having a non-inverting input coupled to the single ended output conductor and an output coupled to an inverting input of the second FET differential amplifier circuit and an inverting input of the FET operational transconductance amplifier.

7. The voltage reference circuit of claim 1 including a low frequency rolloff filter coupled to the output of the first FET differential amplifier to attenuate noise produced in developing the first reference voltage.

8. The voltage reference circuit of claim 6 wherein the second FET differential amplifier circuit includes first and second input FETs having their sources connected together, first and second load devices, a third cascode FET coupling the first load device to a drain of the first input FET, and a fourth cascode FET coupling the second load device to a drain of the second input FET.

9. The voltage reference circuit of claim 6 wherein the FET operational transconductance amplifier includes sixth, seventh, eighth, ninth, tenth, and eleventh FETs, a gate of each of the sixth and eighth FETs being coupled to the single ended output conductor, a source of the sixth FET being coupled to a source of the seventh FET, a gate and drain of the seventh FET being coupled to a gate of the ninth FET, a source of the eighth FET being coupled to a source of the ninth FET, a source of the tenth FET being coupled to a source of the eleventh FET, the output of the FET operational transconductance amplifier being coupled to the sources of the eighth, ninth, tenth, and eleventh FETs, the FET operational transconductance amplifier including a first current mirror circuit coupled to mirror a drain current in the eighth FET through a twelfth FET having a gate and drain coupled to a gate of the tenth FET, and a second current mirror circuit coupled to mirror a drain current in the ninth FET through a thirteenth FET having a gate and drain coupled to a gate of the eleventh FET and a source coupled to a source of the twelfth FET, to produce rapid circuit response to counteract any voltage perturbation imposed on the output of the FET operational transconductance amplifier.

10. A voltage reference circuit that is resistant to power supply noise, comprising in combination:
  (a) a band gap circuit including first and second transistors having different current densities therein and having a resistor coupled between a base of the first transistor and a base of the second transistor, a first FET differential amplifier circuit having first and second input terminals coupled to an emitter of the first transistor and an emitter of the second transistor, respectively;
  (b) a first FET having a gate coupled to an output of the first FET differential amplifier circuit and a source coupled to a first output conductor and producing thereon a first reference voltage;
  (c) feedback means coupled to the output of the first FET differential amplifier circuit for applying a portion of the first reference voltage to maintain a $V_{THERMAL}$ voltage across the resistor equal to the difference between a $V_{BE}$ voltage of the first transistor and a $V_{BE}$ voltage of the second transistor so as to maintain equal voltages on the first and second input terminals;
  (d) a power supply noise rejection circuit including
    i. a cascode FET coupling a drain of the first FET to a first supply voltage conductor,
    ii. a bias circuit connected to the first supply voltage conductor and a gate of the cascode FET to produce a bias voltage on the gate of the cascode FET, the bias circuit including means for attenuating noise on the first supply voltage conductor from reaching the gate of the cascode FET.

11. The voltage reference circuit of claim 10 wherein the attenuating means includes a voltage division circuit coupled between the first supply voltage conductor and the first output conductor, the voltage division circuit having an output coupled to the gate of the cascode FET.

12. The voltage reference circuit of claim 11 including a unity gain buffer circuit including i. a second FET differential amplifier circuit having a non-inverting input coupled to the first output conductor, and a single ended output conductor;

ii. a FET operational transconductance amplifier having a non-inverting input coupled to the single ended output conductor and an output coupled to an inverting input of the second FET differential amplifier circuit and an inverting input of the FET operational transconductance amplifier.

13. A method of producing a stable, low noise reference voltage from a low impedance source, comprising the steps of:

(a) maintaining different current densities in first and second bipolar transistors and maintaining a $V_{THERMAL}$ voltage across the bases of first and second bipolar transistors by means of a first CMOS differential amplifier with a source follower output FET;

(b) producing a first reference voltage at a source of the source follower output FET;

(c) applying a portion of the first reference voltage across a resistor coupled between bases of the first and second bipolar transistors, emitters of the first and second transistors being coupled to the inputs of the first CMOS differential amplifier, respectively;

(d) rejecting power supply variations from the first reference voltage by i. coupling a drain of the source follower output FET to a first supply voltage conductor by means of a cascode FET, and ii. producing a gate voltage of the cascode FET by dividing a voltage difference between the first supply voltage conductor and the first reference voltage conductor so that only a small fraction of any variation of a supply voltage on the supply voltage conductor is coupled to the gate of the cascode FET.

14. The method of claim 13 wherein step (b)(ii) includes mirroring a drain current in the source follower output FET through a voltage divider circuit including a current mirror output FET having a drain coupled to the gate of the cascode FET.

15. The method of claim 13 including i. buffering the first reference voltage by applying it to an input of a second CMOS differential amplifier, ii. applying the output of the second CMOS differential amplifier to an input of a CMOS operational transconductance amplifier, iii. applying an output on an output conductor of the CMOS operational transconductance amplifier to another input of the second CMOS differential amplifier, iv. providing a current mirror circuit responsive to the output voltage of the CMOS operational transconductance amplifier to control gates of an N-channel pullup FET and a P-channel pulldown FET the sources of which are connected to the output conductor to thereby provide low output impedance at the output conductor and rapid response to counteract voltages imposed on the output conductor.

16. The method of claim 15 including supplying surges of charge to absorb current spikes on the output conductor.

17. A unity gain buffer circuit having an output conductor, comprising in combination:

i. a FET differential amplifier circuit having an inverting input coupled to the output conductor, and a single ended output conductor;

ii. a FET operational transconductance amplifier having a non-inverting input coupled to the single ended output conductor and an output coupled to an inverting input of the FET differential amplifier circuit and an inverting input of the FET operational transconductance amplifier, wherein the FET differential amplifier circuit includes first and second input FETs having their sources connected together, first and second load devices, a first cascode FET coupling the first load device to a drain of the first input FET, and a second cascode FET coupling the second load device to a drain of the second input FET.

18. The unity gain buffer circuit of claim 17 wherein the FET operational transconductance amplifier includes first, second, third, fourth, fifth, and sixth FETs, a gate of each of the first and third FETs being coupled to the single ended output conductor, a source of the first FET being coupled to a source of the second FET, a gate and drain of the second FET being coupled to a gate of the fourth FET, a source of the third FET being coupled to a source of the fourth FET, a source of the fifth FET being coupled to a source of the sixth FET, the output of the FET operational transconductance amplifier being coupled to the sources of the third, fourth, fifth, and sixth FETs, the FET operational transconductance amplifier including a first current mirror circuit coupled to mirror a drain current in the third FET through a seventh FET having a gate and drain coupled to a gate of the fifth FET, and a second current mirror circuit coupled to mirror a drain current in the fourth FET through an eighth FET having a gate and drain coupled to a source of the sixth FET and a source coupled to a source of the seventh FET, to produce rapid circuit response to counteract any voltage perturbation produced on the output of the FET operational transconductance amplifier.

19. The unity gain buffer circuit of claim 17 including a current mirror circuit responsive to an output voltage of the FET operational transconductance amplifier to control gates of an N-channel pullup FET and a P-channel pulldown FET the sources of which are connected to the output conductor to thereby provide low output impedance at the output conductor and rapid response to counteract voltages imposed on the output conductor.

20. The unity gain buffer circuit of claim 19 including a capacitor connected to the output conductor large enough to absorb certain current spikes imposed on the output conductor.

21. A unity gain DC reference voltage buffer circuit having an output conductor, comprising in combination:

i. a FET differential amplifier circuit having an inverting input coupled to the output conductor, and a single ended output conductor;

ii. a FET operational transconductance amplifier having a non-inverting input coupled to the single ended output conductor and an output coupled to an inverting input of the FET differential amplifier circuit and an inverting input of the FET operational transconductance amplifier, wherein the FET differential amplifier circuit includes first and second input FETs having their sources connected together, first and second load devices coupled to drains of the first and second input FETs, respectively, a first output FET having a source coupled to the output conductor and a gate coupled to the drain of the second input FET, a second output FET having a source coupled to the output conductor and a gate coupled to the drain of the first input FET, and means coupled to the drains of the first and second input FETs for biasing the gates of the first and second output FETs.

* * * * *